United States Patent [19]

Sarnacki et al.

[11] 3,825,164

[45] July 23, 1974

[54] APPARATUS FOR SOLDERING PRINTED CIRCUIT CARDS

[75] Inventors: Frank H. Sarnacki, Johnson City; Robert V. Steenstrup, Binghamton, both of N.Y.

[73] Assignee: International Business Machines Corporation, Armonk, N.Y.

[22] Filed: Dec. 11, 1972

[21] Appl. No.: 314,080

[52] U.S. Cl. .......... 228/37, 29/496, 29/503, 118/400, 228/40

[51] Int. Cl. .......... B23k 1/08

[58] Field of Search .......... 228/33, 36, 37, 40; 29/484, 496, 503; 118/259, 400

[56] References Cited

UNITED STATES PATENTS

| | | | |
|---|---|---|---|
| 2,321,071 | 6/1943 | Ehrhardt et al. | 29/496 X |
| 2,870,532 | 1/1959 | Young | 29/503 X |
| 3,226,821 | 1/1966 | Van Dijk et al. | 228/36 X |
| 3,298,588 | 1/1967 | Shomphe | 228/33 X |
| 3,452,916 | 7/1969 | Andis | 228/36 |
| 3,755,886 | 9/1973 | Hermann | 29/503 X |

*Primary Examiner*—J. Spencer Overholser
*Assistant Examiner*—Robert J. Craig
*Attorney, Agent, or Firm*—Charles S. Neave

[57] ABSTRACT

A method and apparatus for soldering component devices to a printed circuit card or board by immersing an assembled printed circuit card into a tank of a controllably heated fluxing composition or bath wherein the assembly is preheated to a suitable temperature. A pumping apparatus is applied to a pool of molten solder residing at the bottom of the tank to cause the solder to flow upwardly through a piping system and exit an orifice or plurality of orifices extending transversely of the direction of movement of the printed circuit card assembly. The solder spray system is immersed in the bath and creates a wall of molten solder which is impinged against the printed circuit card to effectively join the components to the printed circuit card as the card is being uniformly withdrawn from the tank at a controlled movement rate.

8 Claims, 1 Drawing Figure

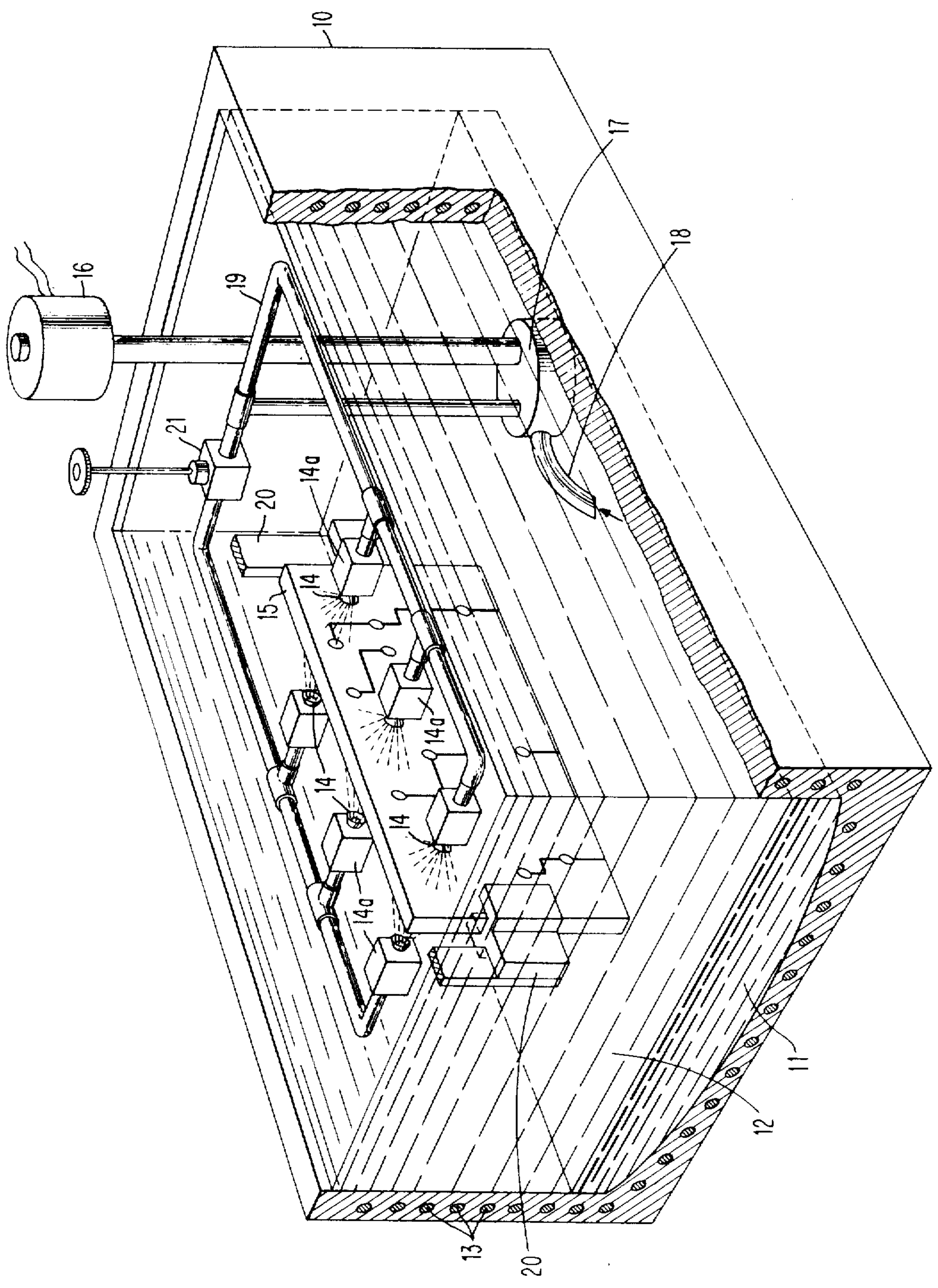
10
16
17
18
19
21
20
14a
14
15
14
14a
14
14
14a
11
12
13
20

APPARATUS FOR SOLDERING PRINTED CIRCUIT CARDS

BACKGROUND OF THE INVENTION

1. Field of the Invention

This invention relates to fluxing and soldering, and in particular, to the method and apparatus adapted for the production line fluxing and soldering of printed circuit cards that are immersed into a tank of a controllably heated fluxing bath and pass through a submerged spray of molten solder that is impinged against the printed circuit card surface to effect the soldering of component devices affixed to the printed circuit card.

2. Description of the Prior Art

Various techniques are commonly used in modern day soldering of product items, as for example, printed circuit cards or the like having a plurality of components that are to be securely attached thereto such as by a solder joining. Frequently, the surfaces to be soldered are pre-cleaned after which flux is applied thereto and the items are preheated. This is followed by passing the surfaces through molten flowing solder or by dipping the items into a pot of molten solder. The requirements for such a production line include several very expensive pieces of equipment as well as requiring different and distinct operations.

Another technique is commonly known as the "wave soldering" technique. In the wave soldering technique, molten solder is continually forced to flow upwardly through a relatively narrow nozzle which generally is elongated transversely of the direction of movement of workpieces. The upwardly flowing solder overflows the nozzle at the discharge end thereof to form a standing wave of molten solder which has a height appreciably above the lower edge of the nozzle through which the solder flows. In this technique, the work to be soldered may be passed horizontally to contact with the standing wave of molten solder. Particular attention must be paid with respect to the movement of the work through the solder wave, relative position of the work moving through the solder wave, and other factors, in order to obtain an adequate surface contact of the solder with the printed circuits and other components and leads to be soldered.

Also, this technique requires higher temperatures to obtain reliable joints and such heat requirements may have a damaging effect upon heat sensitive components being joined to the printed circuit card as well as to the printed circuit card.

In U.S. Pat. No. 3,298,588 there is disclosed another technique for soldering connections to a printed circuit board. A machine particularly adapted to the process comprises a conveyor belt to which the board is attached first passing through a flux tank and then through a flux spray. The liquid flux is pumped to vertical spray nozzles which spray against the board as it passes between them, the excess spray draining from the board and falling back into the tank. The board is then carried by conveyor into a soldering and blast-off tank where the solder is sprayed on both sides of the board by vertically arranged spray nozzles as illustrated in FIG. 6. The excess solder is blasted off both sides of the board almost immediately after soldering by use of peanut oil.

U.S. Pat. No. 3,452,916 teaches of soldering apparatus and a process which includes a tank of molten solder which is sprayed in the form of a "fountain" against the undersurface of the circuit board as it is horizontally conveyed over the tank. In order to maintain the solder in an unoxidized condition, it is necessary to provide a layer or blanket of suitable liquid on the surface thereof to seal the solder from contact with the air and other oxidizing elements.

SUMMARY OF THE INVENTION

The method and apparatus for soldering of the present invention overcomes disadvantages of prior known constructions. It includes features and advantages of providing a soldering spray system submerged in a temperature controlled fluxing bath and particularly adapted to effect surface soldering of printed circuit cards and the like. The use of relatively low melting point solders enables the lowering of processing temperatures to thereby improve packaging stability through a notable reduction in thermal gradients and the differential of expansion stresses resulting therefrom.

Briefly, the apparatus comprises a tank containing a pool of molten solder at the bottom and covered by a fluxing bath, preferably of the water soluble type, heated to a temperature of about 30° F. to 100° F. above the melting point of the solder being used. A solder spray system is submerged in the temperature controlled fluxing bath for applying solder to the surfaces of a printed circuit card during assembly operations. The molten solder is pumped to accomplish a solder joining of components to the printed circuit card. A printed circuit substrate with pinned components held in place is vertically mounted in a fixture such that the pin tips face the solder spray nozzles. The fixture containing the substrate is lowered into the tank at a controlled rate until completely submerged whereupon the motion of the fixture is stopped and the substrate undergoes preheating. As the substrate temperature approaches that of the bath, the molten solder is then pumped from the reservoir at the bottom of the tank to a system of nozzles where a spray of solder is distributed onto the substrate surface in spray patterns providing a uniform distribution of the solder. As the initial solder spray contacts the substrate, the holding fixture is simultaneously withdrawn from the bath at a predetermined rate. The hydraulic action of the spray as well as capillary action causes the solder to fill the pinned and unpinned holes in the substrate surface and form filleted joints. The excess solder not adhering to the substrate is returned to the solder reservoir by gravity.

It is a primary object of the present invention to provide an improved soldering apparatus including a solder spray system adapted for submersion and operation in a preheated fluxing bath.

It is an object of the present invention to provide soldering apparatus for spraying and impinging solders against the surfaces of a printed circuit card or the like to be soldered.

Another object of the present invention is to provide a submersible spray soldering system adapted to utilize relatively low melting point solder alloys which result in lower thermal gradients and a lower differential of expansion stresses.

The foregoing and other objects, features and advantages of the invention will be apparent from the following more particular description of the preferred embodiment of the invention, as illustrated in the accompanying drawing.

BRIEF DESCRIPTION OF THE DRAWING

The FIGURE is a showing of apparatus for soldering printed circuit cards in accordance with the present invention.

DESCRIPTION OF THE PREFERRED EMBODIMENT

Referring to the drawing, there is shown a fluxing and soldering apparatus adapted for the treatment and processing of printed circuit cards, boards or the like and including a tank 10. Within the tank 10 and at the bottom thereof, there is shown a solder reservoir 11 and a fluxing bath solution 12, preferably of the water soluble type, immediately above the solder reservoir 11. The walls and bottom of the tank 10 are equipped with heating coils 13 and with automatic controls (not shown) that function to maintain the temperature of the fluxing bath 12 at about 30° F. to 100° F. above the temperature melting point of the solder alloy in a molten state. Submerged in the fluxing bath solution and preferably located immediately below the surface of the fluxing bath 12 are one or more soldering nozzles 14 depending upon the width of the printed circuit card 15 being soldered and which are supplied with the solder by a solder pumping apparatus 16 from the solder reservoir 11. Alternatively, the nozzles 14 may be arranged in an opposing array, if both sides of the printed circuit substrate 15 are to be soldered. The pump has an impeller 17 and an inlet 18 for the molten solder 11. A conduit 19 conveys the solder upwardly to the nozzle maifolds 14a and outwardly through the nozzles 14 wherein the solder spray is impinged against the printed circuit card 15.

There is shown a holding fixture 20 adapted to support a printed circuit card substrate 15 having component devices (not shown) mounted thereon. The fixture 20 is arranged to support the printed circuit substrate 15 at a predetermined distance from the nozzles 14 when inserted into the tank 10. The nozzles 14 can be arranged to spray solder against only one side of the printed circuit card substrate or board or against both sides of the card simultaneously by means of valve 21.

In operation, a printed circuit card substrate 15 with components held in place by pinning is vertically mounted in the fixture 20 such that the pin tips will face the spray nozzles 14. The fixture 20 then containing the printed circuit substrate 15 is lowered vertically into the tank 10 at a controlled rate until completely submerged in the flux bath solution 12 whereupon the motion of the fixture 20 is stopped and the substrate 15 undergoes a preheating. The preheat period for the substrate 15 is contingent upon: (1) the physical properties of the solder, (2) the physical construction of the printed circuit card 15, (3) the mass of components attached thereto, and (4) the mass and design of the fixture device 20. As the substrate temperature approaches that of the bath 12, and which is greater than the solder melting point, the molten solder is pumped from the reservoir 11 to the nozzle manifolds **14*a* where it is distributed to the nozzles 14 which spray or impinge the solder onto the substrate 15 in a spray pattern accomplishing uniform distribution of the molten solder. As the initial solder spray contacts the printed circuit card substrate 15, the holding fixture 20 is simultaneously withdrawn from the fluxing bath solution 12 at a predetermined rate, which in experimental operations proved most satisfactory at a rate of from about 2 to 7 feet per minute. However, other withdrawal rates may prove more satisfactory when different substrate or solder alloy materials are utilized. The hydraulic action of the spray as well as the capillary action causes the solder to fill the pinned and unpinned holes in the printed circuit card substrate 15** and to form filleted joints at the board surfaces. The amount of solder adhering to the metallic circuitry varies with the spray system characteristics as well as the available alloying surface area. The excess solder not adhering to the printed circuit card substrate is returned to the solder reservoir by gravity.

For example, in experimental operations, a tin-bismuth (Sn-Bi) binary eutectic solder alloy was used. The temperatures of the molten solder reservoir varied from about 300° F. to 320° F. or approximately 30° F. above the melting point of the solder alloy. The temperature of the fluxing bath solution 12 was maintained similarly at approximately the same temperatures above the melting point of the solder alloy. It was found that an acceptable amount of solder was deposited on the printed circuit card substrate 15 surface when the printed circuit card distance from the nozzle 14 was maintained at about 0.5 to 2.0 inches and the withdrawal rate was from 2 to 7 feet per minute and with a solder pumping pressure of from 5 to 10 pounds per square inch. While these parameters provide acceptable soldered surfaces, it is believed that other solder alloys can be utilized satisfactorily. Further, it was found that the positioning of the nozzles 14 below the upper surface level of the water soluble flux composition 12 provided best results when the distance from the surface was from 0.5 inches to 2.5 inches. It was found that the pressure at different submersion depths had a noticeable effect to the results of the solder sprayed surfaces. The amount of deposited solder was varied by changing the operating parameters of the process.

While the invention has been particularly shown and described with reference to a preferred embodiment thereof, it will be understood by those skilled in the art that various changes in form and details may be made therein without departing from the spirit and scope of the invention.

What is claimed is:

1. Apparatus for soldering component parts to printed circuit cards comprising, in combination:

a. a container having molten solder at the bottom thereof, b. a liquid fluxing solution disposed within the container and overlying the molten solder, c. heating means associated with said container for maintaining said solder and fluxing solution at a predetermined temperature, d. solder spraying apparatus disposed within said fluxing solution, e. a carrier fixture for a printed circuit card having parts thereon to be connected by solder, f. means for moving said carrier fixture into and out of the fluxing solution at a predetermined rate and past said solder spraying apparatus, and g. means for pumping the molten solder from the bottom of said container to said solder spraying apparatus for impinging a solder spray against the surface of the printed circuit card as it is moved past the solder spraying apparatus whereby the parts and areas to be joined are connected by solder.

2. Apparatus for soldering component parts to printed circuit cards comprising:

a. a tank having a reservoir of a molten relatively low melting point solder disposed at the bottom of the tank, b. a liquid fluxing solution disposed within the tank and overlying the molten solder, c. heating means disposed about the walls of said tank and operative for maintaining the temperature of said molten solder and said fluxing solution at predetermined temperatures, d. a system of solder spraying apparatus including a plurality of nozzles having orifices therein disposed within said liquid fluxing solution, e. a carrier fixture for supporting a printed circuit card having parts thereon to be connected, f. means for moving said carrier fixture vertically into and out of the liquid fluxing solution at a predetermined rate, and g. means for pumping the molten solder from the bottom of said tank to said solder spraying system for impinging a solder spray against the surface of the printed circuit card as it is moved past the solder spraying apparatus whereby the parts and areas of the printed circuit card to be joined are connected by solder.

3. Apparatus for soldering component parts to printed circuit cards comprising:

a. a tank having a reservoir of a molten relatively low melting point solder disposed at the bottom of the tank, b. a liquid fluxing solution disposed within the tank and overlying the molten solder, c. heating means disposed within the walls of said tank, d. temperature control means operative for maintaining said molten solder and said fluxing solution at predetermined temperatures, e. solder spraying apparatus including at least one nozzle having an orifice therein disposed within said liquid fluxing solution, f. a carrier fixture for supporting a printed circuit card having parts thereon to be connected, g. means for moving said carrier fixture vertically into and out of the liquid fluxing solution at a predetermined rate, and h. means for pumping the molten solder from the bottom of said tank to said solder spraying system for impinging a solder spray against the surface of the printed cirucit card as it is moved past the solder spraying apparatus whereby the parts and areas of the printed circuit card to be joined are connected by solder.

4. Apparatus for soldering component parts to printed circuit cards comprising:

a. a tank having a reservoir of a molten relatively low melting point solder disposed at the bottom of the tank, b. a liquid fluxing solution disposed within the tank and overlying the molten solder, c. heating means disposed peripherally about said tank and operative for maintaining the temperature of said molten solder and said fluxing solution at predetermined temperatures, d. a system of solder spraying apparatus including a plurality of nozzles having orifices therein disposed immediately beneath the surface of said liquid fluxing solution, e. a carrier fixture for supporting a printed circuit card having parts thereon to be connected, f. means for moving said carrier fixture vertically into and out of the liquid fluxing solution and in the vicinity of said solder spraying apparatus at a predetermined rate, and g. pumping means for conveying the molten solder from the bottom of said tank to said solder spraying system for impinging a solder spray against the surface of the printed circuit card as it is moved in front of the solder spraying apparatus whereby the parts and areas of the printed circuit card to be joined are connected by solder.

5. Apparatus for soldering component parts to printed circuit cards as defined in claim 4 wherein the temperature for the molten solder and fluxing solution are maintained at approximately 30° F. above the melting point of the solder.

6. Apparatus for soldering component parts to printed circuit cards as defined in claim 4 wherein the carrier fixture is adapted to move the printed circuit card past the nozzles of the solder spraying apparatus at a distance of from 0.5 inch to 2.0 inches.

7. Apparatus for soldering component parts to printed circuit cards as defined in claim 4 wherein the carrier fixture is adapted to move the printed circuit card past the nozzles of the solder spraying apparatus at a rate of from 2 to 7 feet per minute.

8. Apparatus for soldering component parts to printed circuit cards as defined in claim 4 wherein the pumping means for conveying the molten solder operates in a pressure range of from 5 to 10 pounds per square inch.

* * * * *